United States Patent [19]
Jain et al.

[11] Patent Number: 5,763,937
[45] Date of Patent: Jun. 9, 1998

[54] DEVICE RELIABILITY OF MOS DEVICES USING SILICON RICH PLASMA OXIDE FILMS

[75] Inventors: Vivek Jain, Milpitas; Dipankar Pramanik, Cupertino; Subhash R. Nariani, San Jose; Kuang-Yeh Chang, Los Gatos, all of Calif.

[73] Assignee: VLSI Technology, Inc., San Jose, Calif.

[21] Appl. No.: 277,090

[22] Filed: Jul. 19, 1994

Related U.S. Application Data

[60] Division of Ser. No. 794,922, Nov. 20, 1991, abandoned, which is a continuation-in-part of Ser. No. 775,085, Oct. 11, 1991, Pat. No. 5,374,833, which is a continuation-in-part of Ser. No. 476,089, Mar. 5, 1990, Pat. No. 5,057,897.

[51] Int. Cl.$^6$ .................................................. H01L 23/58
[52] U.S. Cl. ........................... 257/646; 257/396; 257/644
[58] Field of Search .................................. 257/646, 396, 257/644

[56] References Cited

U.S. PATENT DOCUMENTS

| | | | |
|---|---|---|---|
| 3,649,884 | 3/1972 | Haneta | 317/235 R |
| 4,123,565 | 10/1978 | Sumitomo et al. | 427/88 |
| 4,375,125 | 3/1983 | Byatt | 29/588 |
| 4,502,202 | 3/1985 | Malhi | 29/571 |
| 4,555,300 | 11/1985 | Arnold | 156/613 |
| 4,613,888 | 9/1986 | Mase et al. | 357/54 |
| 4,688,078 | 8/1987 | Hseih | 357/23.5 |
| 4,732,801 | 3/1988 | Joshi | 428/198 |
| 4,810,673 | 3/1989 | Freeman | 437/239 |
| 4,972,250 | 11/1990 | Omori et al. | 357/54 |
| 4,996,167 | 2/1991 | Chen | 437/40 |
| 5,047,826 | 9/1991 | Keller et al. | 357/42 |
| 5,057,897 | 10/1991 | Nariani et al. | 357/54 |
| 5,110,766 | 5/1992 | Maeda et al. | 437/228 |
| 5,114,874 | 5/1992 | Custode | 257/634 |
| 5,128,279 | 7/1992 | Nariani et al. | 437/195 |
| 5,128,744 | 7/1992 | Asano et al. | 257/635 |
| 5,252,515 | 10/1993 | Tsai et al. | |
| 5,290,727 | 3/1994 | Jain et al. | 437/238 |

FOREIGN PATENT DOCUMENTS

| | | |
|---|---|---|
| 0 123 726 | 11/1984 | European Pat. Off. |
| WO 93/07644 | 4/1993 | WIPO |
| WO 93/20583 | 10/1993 | WIPO |
| WO 94/29899 | 12/1994 | WIPO |

OTHER PUBLICATIONS

Shimoyama, et al., "Enhanced Hot–Carrier Degradation Due To Water–Related Components in TEOS/O$_3$ Oxide And Water Blocking With ECR SiO$_2$ Film." *8093 IEEE Transactions on Electron Devices*–New York, US, vol. 40, No. 9 (1993).

Yoshdia, et al., "Improvement Of Endurance To Hot Carrier Degradation By Hydrogen Blocking P–SiO," *Technical Digest of the 1988 Int. Electron Device Meeting*, CA, USA, pp. 22–25 (1988).

"Suppression of Hot–Carrier Effects in Submicrometer CMOS Technology", by Chen, Min–Liang et al, *IEEE Transactions on Electron Devices*, vol. 35, No. 12, Dec. 1988, pp. 2210–2220, cited on specification p. 2.

(List continued on next page.)

*Primary Examiner*—Ngân V. Ngô
*Attorney, Agent, or Firm*—Burns, Doane, Swecker & Mathis, LLP

[57] ABSTRACT

The invention relates to MOS devices and methods for fabricating MOS devices having multilayer metallization. In accordance with preferred embodiments, internal passivation is used for suppressing device degradation from internal sources. Preferred devices and methods for fabricating such devices include formation of one or more oxide layers which are enriched with silicon to provide such an internal passivation and improve hot carrier lifetime. Preferred methods for fabricating MOS devices having multi-level metallization include modifying the composition of a PECVD oxide film and, in some embodiments, the location and thickness of such an oxide. In an exemplary preferred embodiment, PECVD oxide layers are modified by changing a composition to a silicon enriched oxide.

12 Claims, 3 Drawing Sheets

OTHER PUBLICATIONS

"Mobil Charge in a Novel Spin–On Oxide (SOX): Detection of Hydrogen in Dielectrics", by N. Lifshitz et al, Journal Electrochem. Soc., vol. 136, No. 5, May 1989, pp. 1440–1446, cited on specification p. 3.

"Hot–Carrier Aging of the MOS transistor in the Presence of Spin–On Glass as the Interlevel Dielectric", by N. Lifshitz et al, IEEE Electron Device Letters, vol. 12, No. 3, Mar. 1991, pp. 140–142, cited on specification p. 3.

"Charge Loss in EPROM Due to Ion Generation and Transport in Interlevel Dielectric", by G. Crisenza et al, Proceedings of IEEE IEDM, 1990, pp. 107–110, cited on specification p. 3.

"Electroluminescence Studies in Silicon Dioxide Films Containing Tiny Silicon Islands", by D.J. DiMaria et al, Journal of Appl. Phys., vol. 56, Jul. 1984, pp. 401–416, cited on specification p. 1.

"Improvement of Endurance To Hot Carrier Degradation By Hydrogen Blocking P–SiO", by S. Yoshida et al, IEEE IEDM 1988, pp. 22–25.

"Field Inversion in CMOS Double Metal Circuits Due to Carbon Based SOGS", by D. Pramanik et al, Proceedings of IEEE VMIC 1989, pp. 454–462, cited on specification pp. 3 and 12.

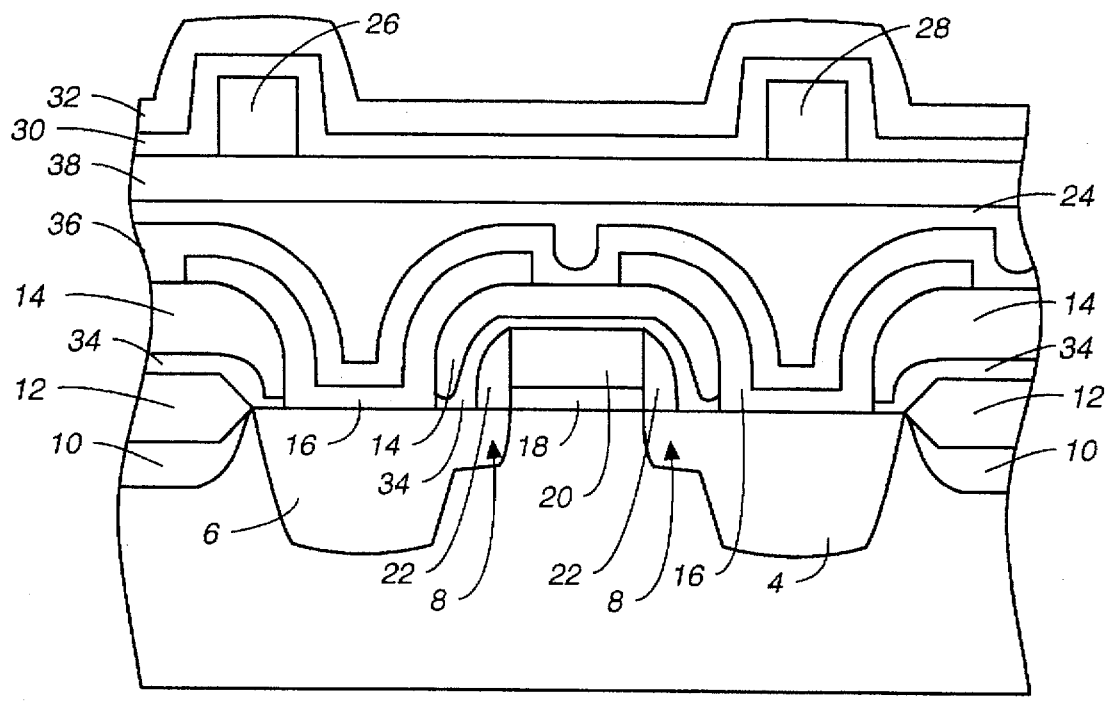
FIG._1
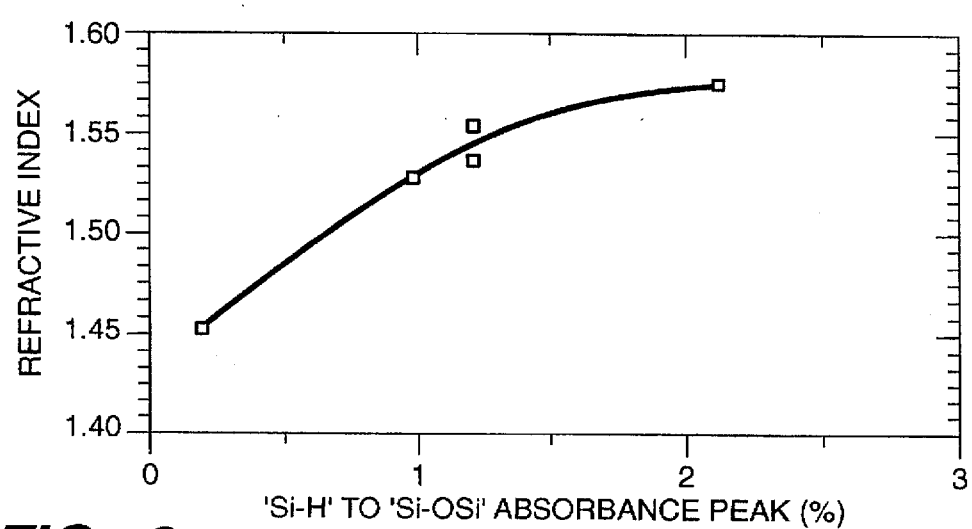
FIG._2

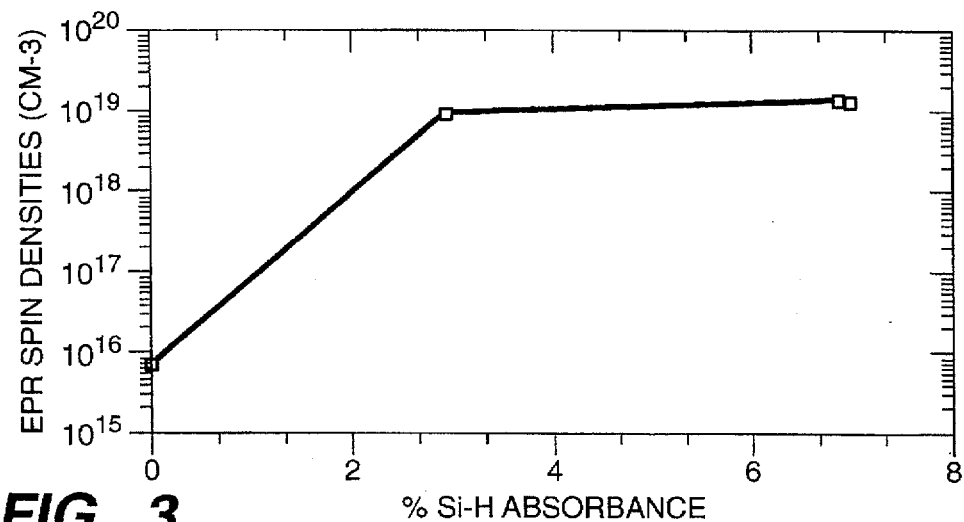
FIG._3
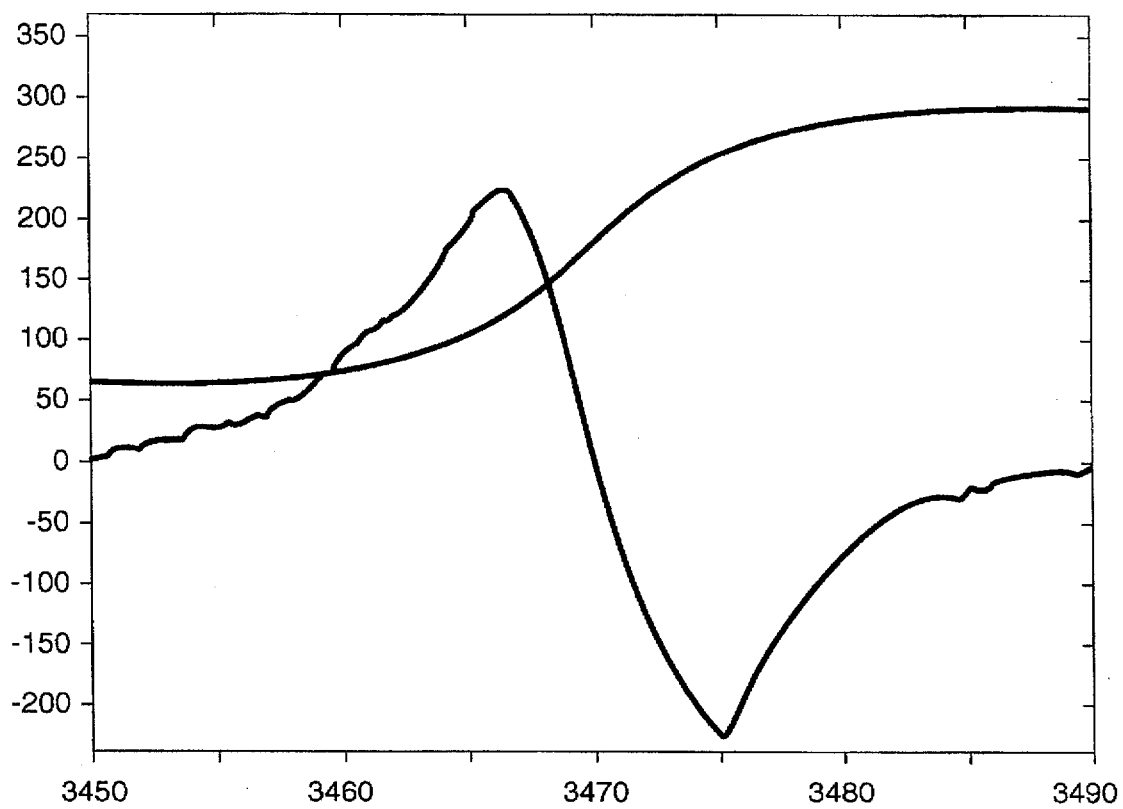
FIG._4

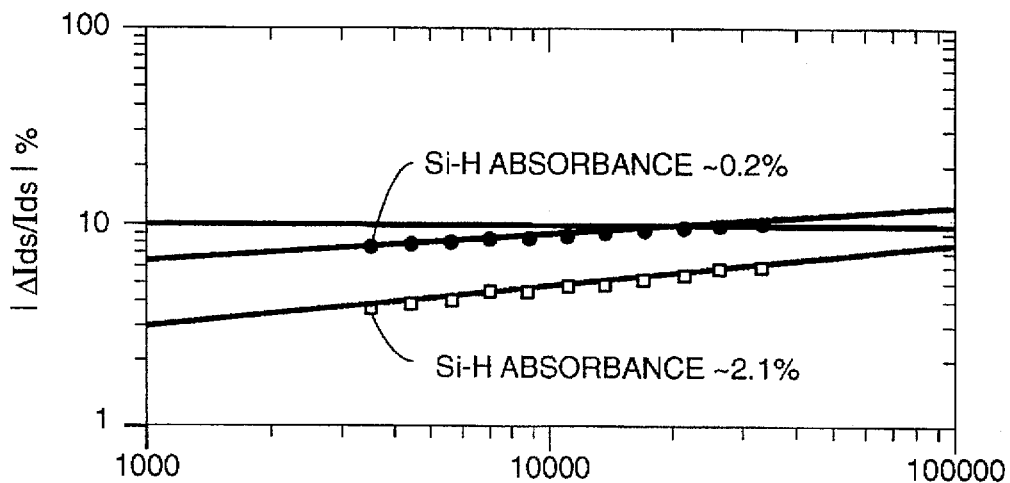
FIG._5
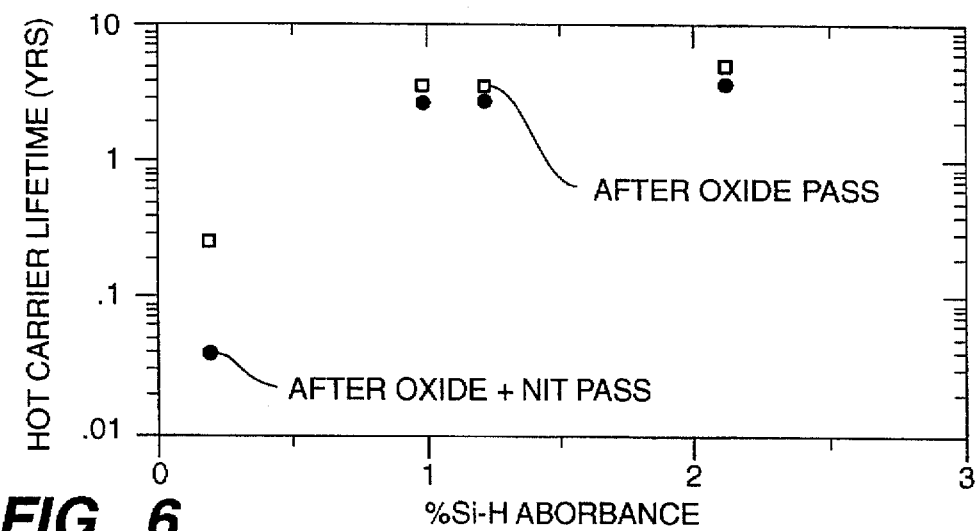
FIG._6
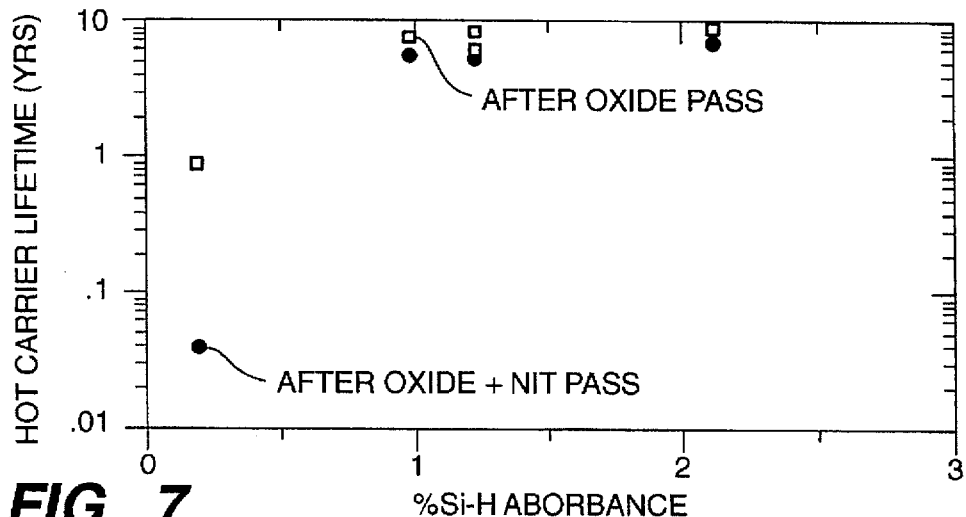
FIG._7

DEVICE RELIABILITY OF MOS DEVICES USING SILICON RICH PLASMA OXIDE FILMS

This application is a divisional of application Ser. No. 07/794,922, filed Nov. 20, 1991, now abandoned, which in turn is a Continuation-In-Part of application Ser. No. 07/775,085, filed Oct. 11, 1991, now U.S. Pat. No. 5,374,833, which in turn is a Continuation-In-Part of application Ser. No. 07/476,089, filed Mar. 5, 1990, now U.S. Pat. No. 5,057,897.

BACKGROUND OF THE INVENTION

1. Field of the Invention

The present invention relates generally to integrated circuits and multilayer structures for fabricating integrated circuits. More particularly, the invention relates to particular multilayer structures and methods of fabricating multilayer structures using modified oxide layers to improve hot carrier reliability in MOS devices.

2. State of the Art

The continual reduction of MOS device size has led to device reliability concerns. For example, failure to proportionally scale down the electric fields involved has reduced device reliability. Further, shrinking geometries have led to increased use of plasma-assisted etching and deposition processing for multilevel interconnect schemes. These plasma assisted processes can also lead to device instability and poor hot electron reliability.

For example, topside passivation layers of plasma enhanced chemical vapor deposition (PECVD) oxide and PECVD nitride have commonly been used to protect IC devices from external sources of device degradation such as sodium ions and moisture. However, the susceptibility of integrated circuits (ICs) to internal sources of device degradation such as charge buildup, charge trapping and the electric fields induced due to backend processing (i.e., fabrication of metallization layers for interconnections) has not been adequately addressed.

Past studies such as those described in the article by M. Chen et al, IEEE Trans. Elec. Device, Vol. 12, 2210 (1988) have shown that silicon nitride passivation layers (e.g., PECVD plasma silicon nitride) used for passivation and reactive ion etch (RIE) of metal layers worsen hot electron effects (e.g., decreases hot carrier lifetimes). Similarly, the use of spin-on-glass (SOG) as part of the intermetal oxide decreases hot carrier lifetimes. Further, water adsorption in PECVD oxides and SOG result in generation of positive mobile charges with degradation of hot carrier lifetimes as described in N. Lifshitz et al, J. Electrochem. Soc., vol 136, 1440 (1989) and N. Lifshitz et al, IEEE Elec. dev. Lett. vol 12, 140 (1991). In addition, the use of carbon based SOG in intermetal oxide leads to field inversion as described in D. Pramanik et al, Proc. of IEEE VMIC, 454, (1989). Also charge loss in EPROMS has been attributed to mobile positive ion generation in the interlevel dielectric as described by G. Crisenza et al, Proc. of IEEE IEDM, 107 (1990). These origins of device degradation are internal rather than external.

In pursuing techniques for reducing device degradation such as hot carrier effects due to internal sources, hot carrier effects have been divided into three general areas: hot carrier generation, hot carrier injection and hot carrier trapping. In general, hot carrier generation and injection are determined by device structure (i.e., electrical field intensity developed within the device) while hot carrier trapping is dependent on the integrated circuit fabrication processes and dielectric properties.

MOS device structures have been modified in the past to reduce hot carrier effects. For example, lightly doped drain (LDD) structures have been used to improve hot carrier lifetimes for sub-micron devices by reducing the electric fields generated. Although such modified device structures do reduce device degradation, the use of plasma processes and SOG layers in the backend processing can still significantly degrade hot carrier lifetimes for all types of device structures.

SUMMARY OF THE INVENTION

In accordance with preferred embodiments of the present invention, internal passivation is used for suppressing device degradation from internal sources. As referenced herein, internal passivation refers to the design of MOS device structures which are immune to degradation caused by, for example, backend processing involved in multi-level metallization. MOS devices can thus be fabricated that are immune to hot carrier degradation due to the backend processes. Such MOS devices have a greatly improved hot carrier reliability.

In a preferred embodiment, fabrication using an internal passivation/gettering layer provides built-in-reliability and has wider applicability than the traditional approach of identifying and eliminating/suppressing the source of each specific degradation. Preferred methods for fabricating MOS devices having multi-level metallization include modifying the composition of a PECVD oxide film and, in some embodiments, the location and thickness of such an oxide. In an exemplary preferred embodiment, PECVD oxide layers are modified by changing the composition to a silicon enriched oxide. The silicon enriched oxide includes higher dangling bond density which prevents various mobile-species (including hydrogen) generated during backend processing from reaching the gate oxide area of the MOS device and thereby improves the hot carrier lifetime. According to other preferred embodiments of the invention, these modified oxide layers are formed beneath one or more of a nitride passivation layer; an oxide passivation layer, a SOG layer and a boron-phosphorous silicate glass (BPSG) layer.

Additionally, the present invention recognizes that hydrogen, released during reactions involving the nitride passivation layer, is not the only source for inducing device degradation due to hot carrier effects. Accordingly, other preferred embodiments provide modified oxide layers formed in locations for reducing hot carrier effects caused by other fabrication processes, such as high voltage plasma deposition or etching.

BRIEF DESCRIPTION OF THE DRAWINGS

These and other advantages and objects of the invention will become more apparent from the following detailed description of preferred embodiments when read in conjunction with the attached Figures in which:

FIG. 1 is a cross-sectional view of a multilayer MOS device according to a preferred embodiment;

FIGS. 2–4 illustrate characteristics of the oxide; and

FIGS. 5–7 illustrate hot carrier characteristics of the device.

DETAILED DESCRIPTION OF THE PREFERRED EMBODIMENTS

In a preferred exemplary embodiment described herein, a composition of a PECVD oxide film is tailored to provide a layer of internal passivation capable of suppressing device degradation due, for example, to backend processes. Such internal passivation suppresses, for example, the field inversion due to a carbon based SOG in an intermetal oxide and the hot carrier degradation due to hydrogen from a nitride passivation.

A generalized cross-section of a multilayer MOS device according to an exemplary embodiment is illustrated in FIG. 1. Each of the layers to be described is formed using conventional semiconductor fabrication techniques such as chemical vapor deposition, high temperature oxidation, and photolithographic patterning.

A p-type substrate 2 is formed from a semiconductor material such as silicon. The substrate 2 is implanted with n-type dopants to create source 4 and drain 6 areas and, in this exemplary embodiment, lightly doped areas 8 are provided to reduce the electric field as discussed above.

Field implant regions (i.e., channel stops) 10 are implanted with p-type dopants to electrically isolate the MOS device from similar adjacent devices. For the same reason, field oxide regions 12 are grown or deposited on the substrate in the areas overlying the field implant regions 10.

A gate oxide layer 18 is grown on the substrate. A polysilicon/polycide gate 20 is deposited and patterned to form the MOS device structure. Spacers 22 are provided to form LDD structures. A BPSG layer 14 is a dielectric layer which buffers the polysilicon/polycide gate 20 from a first level of metal traces 16. The metal traces connect various MOS devices.

An SOG layer 24 applied to the MOS device in a liquid form planarizes the valleys created by previous fabrication steps. Another metal trace layer 26, 28 provides additional connections between devices formed in the IC. An oxide passivation layer 30 and a nitride passivation layer 32 are provided to protect the MOS device from moisture and other ambient effects.

Silicon enriched oxide layers 34, 36, and 38 are provided to improve hot carrier reliability of the MOS device. Generally speaking, these layers can be provided beneath any layers which may be sources of moisture, carbon, hydrogen and/or subjected to damage induced by plasma processes. In the exemplary embodiment illustrated in FIG. 1, the silicon enriched oxide layers 34, 36, and 38 are formed beneath each of the BPSG, SOG, and oxide\nitride passivation layers, respectively.

An exemplary experimental embodiment is described below to generally illustrate the effects of using silicon enriched PECVD oxide layers in a MOS device. According to this experimental embodiment, MOS devices were fabricated using a 0.8 µm CMOS technology with 165 angstrom gate oxide, LDD structures, polycide gates and double level metal process.

In an exemplary embodiment, an intermetal oxide layer was formed as a sandwich composition (i.e., oxide sandwich located between first and second metallization layers) which included three layers: a first PECVD oxide film, an SOG layer, and a second PECVD oxide film. In the experimental embodiment, the oxide layer sandwich consisted of 2500 angstroms of $SiH_4$ based PECVD oxide film followed by two layers of carbon-based siloxane SOG and capped by a second film consisting of 5000 angstroms of PECVD oxide. The latter PECVD oxide film was placed on the two SOG layers without any etchback of the SOG. A passivation layer on top of the second metal trace layer consisted of two layers of dielectric, a PECVD oxide (5000 angstroms) followed by a PECVD nitride (1.0 µm). A commercially available PECVD reactor was used for PECVD oxide deposition.

Typical deposition temperature was 400° C. In the examples shown, the deposition pressure was approximately 2 Torr. Reactant gases used were silane (i.e., $SiH_4$), nitrous oxide (i.e., $N_2O$) and nitrogen (i.e., $N_2$). The PECVD oxide layer composition was modified by varying the deposition conditions to enrich the PECVD oxide with silicon.

The PECVD oxide film was characterized using FTIR measurements in addition to refractive index (RI), stress and wet etch rates. Si—O—Si stretch band position, full width at half maximum (FWHM) for Si—O—Si stretch band, Si—H peak position and Si—H peak heights were measured. Electron spin density measurements were made to estimate dangling bond density. These properties were correlated to the ability to suppress device degradation.

The change in RI is a function of Si—H content in the film as shown in FIG. 2. As shown in FIG. 2, stoichiometric silicon dioxide with nearly zero percent Si—H content corresponds with a RI of 1.452. Increases in the silicon richness results in increases in the RI.

Dangling bond spin density also increases with increasing Si—H percentage content as shown in FIG. 3. More particularly, spin density measurements based on electron paramagnetic spin resonance (EPR) measurements show orders of magnitude higher spin densities for the modified oxides with higher Si—H contents. The increase in the Si—H peak with higher spin densities indicates that the modified PECVD oxide films have higher dangling bond densities. A sample fingerprint of the EPR spectra for the modified oxide is shown in FIG. 4.

The g-value of the silicon rich oxide is in the range 2.005 and 2.006 and corresponds to A and B resonances described by DiMaria et al in the document J. Appl. Phys. vol. 56,401 (1984) wherein the A-line is attributed to the dangling bonds in an amorphous silicon environment and the B-line is attributed to the dangling bonds at the interface between amorphous silicon and $SiO_2$ components. It is important to note that it is the type of defect rather than the total spin densities that is critical to achieve the desired internal passivation and built-in-reliability.

The effect of the oxide composition on its ability to suppress device degradation was measured on field isolation transistors and active area n-channel transistors. The corresponding manifestations of device degradation were field $V_t$ shifts and enhanced hot carrier degradation relative to their values at the first (i.e., lower) metal trace layer.

The standard stoichiometric PECVD oxide is unable to suppress any device degradation resulting in shorted field transistors. These shorted field transistors can be turned off by applying a negative back bias of 1.5 volts indicating the presence of positive charge over the field oxide. On the other hand, the modified silicon rich oxide in the intermetal oxide layers results in no $V_t$ shift of the field transistor. A positive charge density of the order of $1E12/cm^2$ would be required to cause such a field inversion. An interaction of hydrogen with carbon in the SOG results in the formation of positive charges that lead to field inversion as described in D. Pramanik et al, Proc. of IEEE VMIC, 454, (1989). The silicon rich oxide acts to neutralize the effect of the positive charge formation. The field threshold is clearly affected by the composition of the oxide film.

Hot carrier lifetime measurements were made after oxide passivation (first layer of passivation film) and repeated after second layer passivation of plasma nitride film. This approach was taken to identify the role of modified PECVD oxide film and its subsequent interaction with the hydrogen from the PECVD nitride film. The change in drain current of an n-MOS transistor at $V_{gs}=5.0$ V, $V_{ds}=0.1$ V and change in $V_t$ were used to quantify the degradation from hot carrier injection. The stress conditions were $V_{ds}=7.0$ V and $V_{gs}=2.0$ V. The $L_{eff}$ was around 0.55 μm for all the hot carrier lifetime measurements.

FIG. 5 illustrates the decrease in the drain-source current $I_{ds}$ as a function of stress time for two different PECVD oxide films after oxide passivation but before nitride passivation. It is clear in FIG. 5 that significant improvement in the hot carrier lifetime can be made even prior to nitride passivation by modifying the oxide composition.

The estimated lifetimes based on a 100 mV change in $V_t$ and a 10% change in drain current are shown in FIGS. 6 and 7, respectively. The plots clearly show that modifying the PECVD oxide film can result in more than an order of magnitude improvement in hot carrier lifetime even prior to nitride passivation. The silicon rich oxide films showed very little degradation due to nitride passivation while the stoichiometric oxide shows more than an order of magnitude drop in hot carrier lifetime after nitride passivation.

Trends in hot carrier lifetime based on $V_t$ change are similar to those based on $I_{ds}$ change and suggest that the hot carrier degradation is due to interface trapping rather than bulk trapping. This shows that the modified PECVD oxide film prevents some mobile species (e.g., hydrogen) from getting to the interface. This hydrogen may come from the backend plasma processes as well as from the silicon nitride passivation. Silicon rich oxide films have higher dangling bond density than stoichiometric oxide and these dangling bonds appear to act as trap centers for the hydrogen or other mobile species. As a result, better hot carrier performance is achieved.

A vast improvement in hot carrier lifetimes even prior to nitride passivation (the source of hydrogen) shows that hydrogen is not the only mechanism responsible for degradation in hot carrier reliability in multilevel metallization. Plasma processes used for multilevel metallization can degrade the hot carrier reliability. The results illustrated by the aforementioned exemplary embodiment confirm that the modified PECVD oxide layers suppress the backend induced degradation.

In alternate preferred embodiments, the SOG layer 24 of FIG. 1 is etched prior to cap PECVD oxide deposition. This etching removes portions of the SOG and therefore reduces the amount of SOG which can produce device degradation. In this case, the oxide layers shown in FIG. 1 can still be used in a preferred embodiment to prevent hot carrier degradation within the device as described above. Thus, the present invention can even be used to further provide internal passivation in device structures where, for example, dielectric layers have been etched.

Further, it will be appreciated by those skilled in the art that the present invention is not limited to use of two metallization layers. Rather, intermetal oxide layers as described above can be used between any number of metallization layers.

It will be appreciated by those skilled in the art that the present invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. An integrated circuit having improved hot carrier reliability comprising:

a substrate;

a plurality of electrical devices formed on said substrate, at least one of said plurality of electrical devices having a gate;

isolation means provided between each of said electrical devices;

at least one metallization layer for interconnecting the electrical devices;

a first dielectric layer located adjacent said metallization layer; and a first silicon-enriched oxide layer located on said isolation means, and between said first dielectric layer and said gate.

2. An integrated circuit according to claim 1 further comprising a second silicon-enriched oxide layer located on a second side of said first dielectric layer opposite said first silicon-enriched oxide.

3. An integrated circuit according to claim 2 further comprising:

a planarization layer formed on said second silicon-enriched oxide layer; and a third silicon-enriched intermetal oxide layer formed on said planarization layer.

4. An integrated circuit according to claim 3 wherein said planarization layer is etched back.

5. An integrated circuit according to claim 1 wherein said dielectric layer is a BPSG layer.

6. An integrated circuit according to claim 3 wherein said planarization layer is a spin-on-glass layer.

7. An integrated circuit according to claim 3 further comprising:

a second metallization layer formed on said third silicon-enriched intermetal oxide layer; and one or more passivation layers formed on said second metallization layer.

8. A multilayer MOS structure having improved hot carrier reliability comprising:

a substrate;

a plurality of electrical devices formed on said substrate;

an isolation layer for electrically isolating said electrical devices from one another;

a plurality of dielectric, metallization, and passivation layers formed on and around said electrical devices; and means located on said isolation layer and a gate of said electrical devices, and having at least one of a composition, location and thickness selected for suppressing backend processing induced device degradation.

9. A multilayer MOS structure according to claim 8 wherein said degradation includes hot electron lifetime, field threshold voltage shifts and charge loss, and wherein said means for suppressing further includes one or more layers of silicon-enriched oxide formed beneath one or more of said dielectric or passivation layers.

10. An integrated circuit according to claim 8 wherein said means for suppressing backend processing induced device degradation includes a silicon rich oxide layer wherein said silicon rich oxide is obtained by increasing refractive index and/or dangling bond density and/or Si—H content of an oxide layer.

11. An integrated circuit including:

at least two electrical devices; and a first silicon-enriched oxide layer located on an isolation means between said at least two electrical devices and on a gate of said at least two electrical devices, said integrated circuit being formed by a method which includes the steps of:

forming said plurality of electrical devices on a substrate;

forming said isolation means for electrically isolating the electrical devices between said devices;

forming said first silicon-enriched oxide layer on said isolation means and gates of said electrical devices; and forming a dielectric layer on said first silicon-enriched oxide layer.

12. An integrated circuit according to claim 11 wherein said step of forming a first silicon enriched oxide layer further includes the step of increasing the refractive index, the dangling bond density and the Si—H content of an oxide layer.

* * * * *